(12) United States Patent
Niwa

(10) Patent No.: US 11,404,411 B2
(45) Date of Patent: Aug. 2, 2022

(54) SEMICONDUCTOR DEVICE HAVING ALTERNATELY ARRANGED IGBT REGIONS AND DIODE REGIONS

(71) Applicant: DENSO CORPORATION, Kariya (JP)

(72) Inventor: Fumikazu Niwa, Toyota (JP)

(73) Assignee: DENSO CORPORATION, Kariya (JP)

( * ) Notice: Subject to any disclaimer, the term of this patent is extended or adjusted under 35 U.S.C. 154(b) by 31 days.

(21) Appl. No.: 16/213,123

(22) Filed: Dec. 7, 2018

(65) Prior Publication Data
US 2019/0181136 A1 Jun. 13, 2019

(30) Foreign Application Priority Data
Dec. 11, 2017 (JP) .............................. JP2017-237121

(51) Int. Cl.
| | |
|---|---|
| H01L 29/06 | (2006.01) |
| H01L 27/06 | (2006.01) |
| H01L 27/07 | (2006.01) |
| H01L 29/10 | (2006.01) |
| H01L 29/40 | (2006.01) |
| H01L 29/739 | (2006.01) |
| H01L 29/861 | (2006.01) |

(52) U.S. Cl.
CPC ...... *H01L 27/0664* (2013.01); *H01L 27/0727* (2013.01); *H01L 29/1095* (2013.01); *H01L 29/407* (2013.01); *H01L 29/7397* (2013.01); *H01L 29/8613* (2013.01)

(58) Field of Classification Search
CPC ............. H01L 27/0652; H01L 27/0664; H01L 27/0761; H01L 29/1095; H01L 29/7397
See application file for complete search history.

(56) References Cited

U.S. PATENT DOCUMENTS

| | | |
|---|---|---|
| 2012/0181575 A1 | 7/2012 | Pfirsch |
| 2012/0319163 A1 | 12/2012 | Tsuzuki et al. |
| 2013/0260515 A1 | 10/2013 | Mizushima |
| 2014/0027814 A1 | 1/2014 | Pfirsch |
| 2014/0070270 A1 | 3/2014 | Koshida et al. |

(Continued)

FOREIGN PATENT DOCUMENTS

| | | |
|---|---|---|
| CN | 104576720 A | 4/2015 |
| DE | 102012100349 A1 | 7/2012 |

(Continued)

*Primary Examiner* — Suberr L Chi
(74) *Attorney, Agent, or Firm* — Hunton Andrews Kurth LLP

(57) ABSTRACT

A semiconductor device may have a semiconductor substrate. The semiconductor substrate may include an IGBT region that overlaps with a collector region and a diode region that overlaps with a cathode region. The semiconductor substrate may include a drift region distributed across the IGBT region and the diode region, a body region, a body contact region, and an emitter region arranged in the IGBT region, and an anode region and an anode contact region arranged in the diode region. The body region may include a first body region and a second body region having a p-type impurity density lower than any of that in the first body region and that in the anode region. The second body region may be adjacent to the anode region. The first body region may be adjacent to the second body region at an opposite side from the anode region.

4 Claims, 9 Drawing Sheets

(56) References Cited

U.S. PATENT DOCUMENTS

2016/0247808 A1\* 8/2016 Horiuchi ................. H01L 29/78
2017/0047322 A1 2/2017 Yoshida et al.

FOREIGN PATENT DOCUMENTS

| JP | 2008-300529 A | 12/2008 |
|----|---------------|---------|
| JP | 2013-021304 A | 1/2013 |
| JP | 2013-197306 A | 9/2013 |
| JP | 2014075582 A | 4/2014 |
| WO | 2016-080269 A1 | 5/2016 |

\* cited by examiner

SEMICONDUCTOR DEVICE HAVING ALTERNATELY ARRANGED IGBT REGIONS AND DIODE REGIONS

TECHNICAL FIELD

The technique disclosed herein relates to a semiconductor device.

BACKGROUND

JP 2013-197306 A describes a semiconductor device provided with an IGBT (insulated gate bipolar transistor) region and a diode region. This semiconductor device includes a semiconductor substrate, an upper electrode, and a lower electrode. The upper electrode is provided on an upper surface of the semiconductor substrate, and the lower electrode is provided on a lower surface of the semiconductor substrate. A diode is provided in the diode region such that the upper electrode serves as an anode electrode and the lower electrode serves as a cathode electrode. An IGBT is provided in the IGBT region such that the upper electrode serves as an emitter electrode and the lower electrode serves as a collector electrode. The IGBT provided in the IGBT region is a trench gate type IGBT.

SUMMARY

In the semiconductor device of JP 2013-197306 A, the diode turns on when a potential of the upper electrode becomes higher than a potential of the lower electrode, and holes flow from an anode region to a cathode region. Further, in the semiconductor device of JP 2013-197306 A, a body region in the IGBT region is adjacent to the anode region with a trench in between them. Due to this, the body region is arranged very close to the anode region. Thus, when the diode turns on, halls flow in a path from the body region in the IGBT region toward the cathode region in the diode region as well. Due to this, in a state where the diode is on, a hole density in the drift region becomes high in a vicinity of a boundary between the diode region and the IGBT region. When the potential of the upper electrode becomes lower than the potential of the lower electrode thereafter, the diode performs a recovery operation and the holes in the drift region flow toward the upper electrode. When the holes flow as above, recovery current thereby flows. In a state where the diode is on, the recovery current flows at a high concentration in the vicinity of the boundary between the diode region and the IGBT region due to the high hole density in the vicinity of the boundary between the diode region and the IGBT region. Due to this, there has been a problem that a high load is applied to the semiconductor substrate in the vicinity of the boundary between the diode region and the IGBT region. The disclosure herein proposes a technique that reduces a load on a semiconductor substrate in a vicinity of a boundary between a diode region and an IGBT region.

A semiconductor device disclosed herein may comprise a semiconductor substrate, a trench, a gate insulating film, a gate electrode, an upper electrode, and a lower electrode. The trench may be provided in an upper surface of the semiconductor substrate. The gate insulating film may be provided in the trench. The gate electrode may be provided in the trench and insulated from the semiconductor substrate by the gate insulating film. The upper electrode may be in contact with the upper surface. The lower electrode may be in contact with a lower surface of the semiconductor substrate. The semiconductor substrate may comprise a collector region of p-type and a cathode region of n-type in a range being in contact with the lower electrode. In a plan view of the semiconductor substrate along a thickness direction of the semiconductor substrate, a semiconductor region overlapping with the collector region may be an IGBT region and a semiconductor region overlapping with the cathode region may be a diode region. The trench may be provided in the IGBT region. The semiconductor substrate may comprise: a drift region, a body region, a body contact region, an emitter region, an anode region, and an anode contact region. The drift region of n-type may be distributed across the IGBT region and the diode region, may be provided above the collector region and the cathode region, and may be in contact with the gate insulating film. The body region of p-type may be provided above the drift region in the IGBT region, and may be in contact with the gate insulating film. The body contact region of p-type may be provided above the body region, may have a p-type impurity density higher than a p-type impurity density in the body region, and may be in contact with the upper electrode. The emitter region of n-type may be provided above the body region, may be in contact with the upper electrode, may be in contact with the gate insulating film, and may be separated from the drift region by the body region. The anode region of p-type may be provided above the drift region in the diode region. The anode contact region of p-type may be provided above the anode region, may have a p-type impurity density higher than a p-type impurity density in the anode region, and may be in contact with the upper electrode. The body region may comprise a first body region and a second body region having a p-type impurity density lower than any of a p-type impurity density in the first body region and the p-type impurity density in the anode region. The second body region may be adjacent to the anode region, and the first body region may be adjacent to the second body region at an opposite side from the anode region.

The second body region may be directly adjacent to the anode region, or may be adjacent thereto with the trench in between them. The first body region may be directly adjacent to the second body region, or may be adjacent thereto with the trench in between them. The drift region may be in contact with the collector region and the cathode region, or another semiconductor region may be arranged in at least between the drift region and the collector region or between the drift region and the cathode region. The body region may be in contact with the drift region, or another semiconductor region may be arranged between the body region and the drift region. The anode region may be in contact with the drift region, or another semiconductor region may be arranged between the anode region and the drift region.

In this configuration, the second body region is adjacent to the anode region. Thus, when the diode in the diode region is turned on, holes flow from the second body region in the IGBT region to the cathode region. Since the p-type impurity density of the second body region is low, the holes flowing from the second body region toward the cathode region is not large in number. Thus, the hole density does not become so high in the drift region in a vicinity of a boundary between the diode region and the IGBT region. Due to this, high recovery current is suppressed from flowing in the vicinity of the boundary between the diode region and the IGBT region during a recovery operation. According to this, a load applied to the semiconductor substrate in the vicinity of the boundary between the diode region and the IGBT region can be reduced. Further, the first body region arranged at a position separated away from the anode region has the higher p-type impurity density than the second body region. Since the first body region is separated away from the anode region, there hardly is any effect on the recovery current even if the p-type impurity density of the first body region is high. Further, by setting the p-type impurity density of the first body region high, characteristics of the IGBT can be improved.

DETAILED DESCRIPTION

Figure 1:
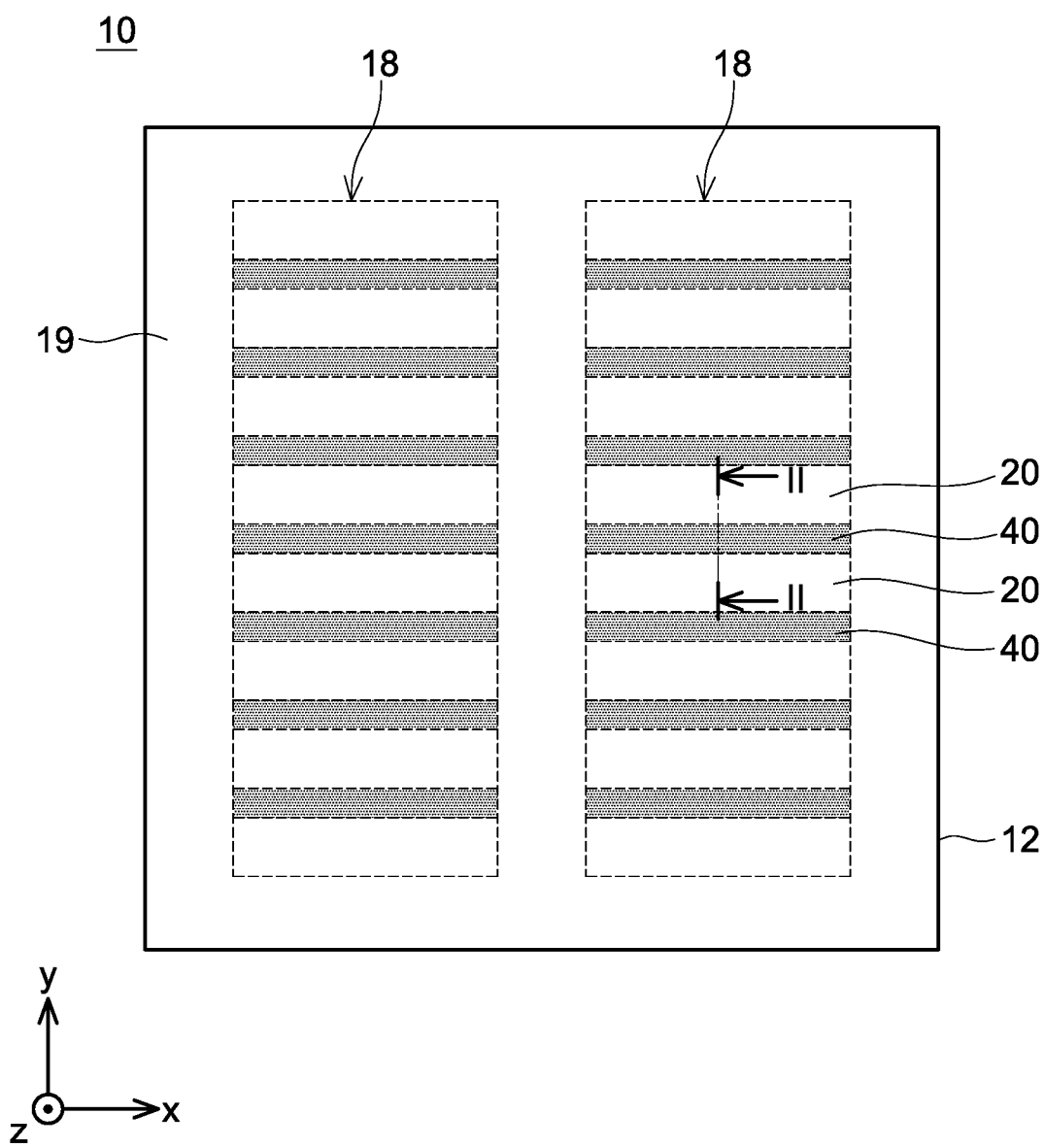
FIG. 1 is a plan view of a semiconductor device 10.

As shown in FIG. 1, a semiconductor device 10 of an embodiment includes a semiconductor substrate 12. The semiconductor substrate 12 is a silicon substrate. Hereinbelow, a thickness direction of the semiconductor substrate 12 will be termed a z direction, one direction parallel to an upper surface 12a of the semiconductor substrate 12 will be termed an x direction, and a direction parallel to the upper surface 12a of the semiconductor substrate 12 and perpendicular to the x direction will be termed a y direction. As shown in FIG. 1, the semiconductor substrate 12 includes two element regions 18 and a voltage withstanding region 19 surrounding the element regions 18. Each element region 18 includes IGBT regions 20 and diode regions 40. In each element region 18, the IGBT regions 20 and the diode regions 40 are provided alternately in the y direction. An IGBT is provided in each IGBT region 20 and a diode is provided in each diode region 40.

Figure 2:
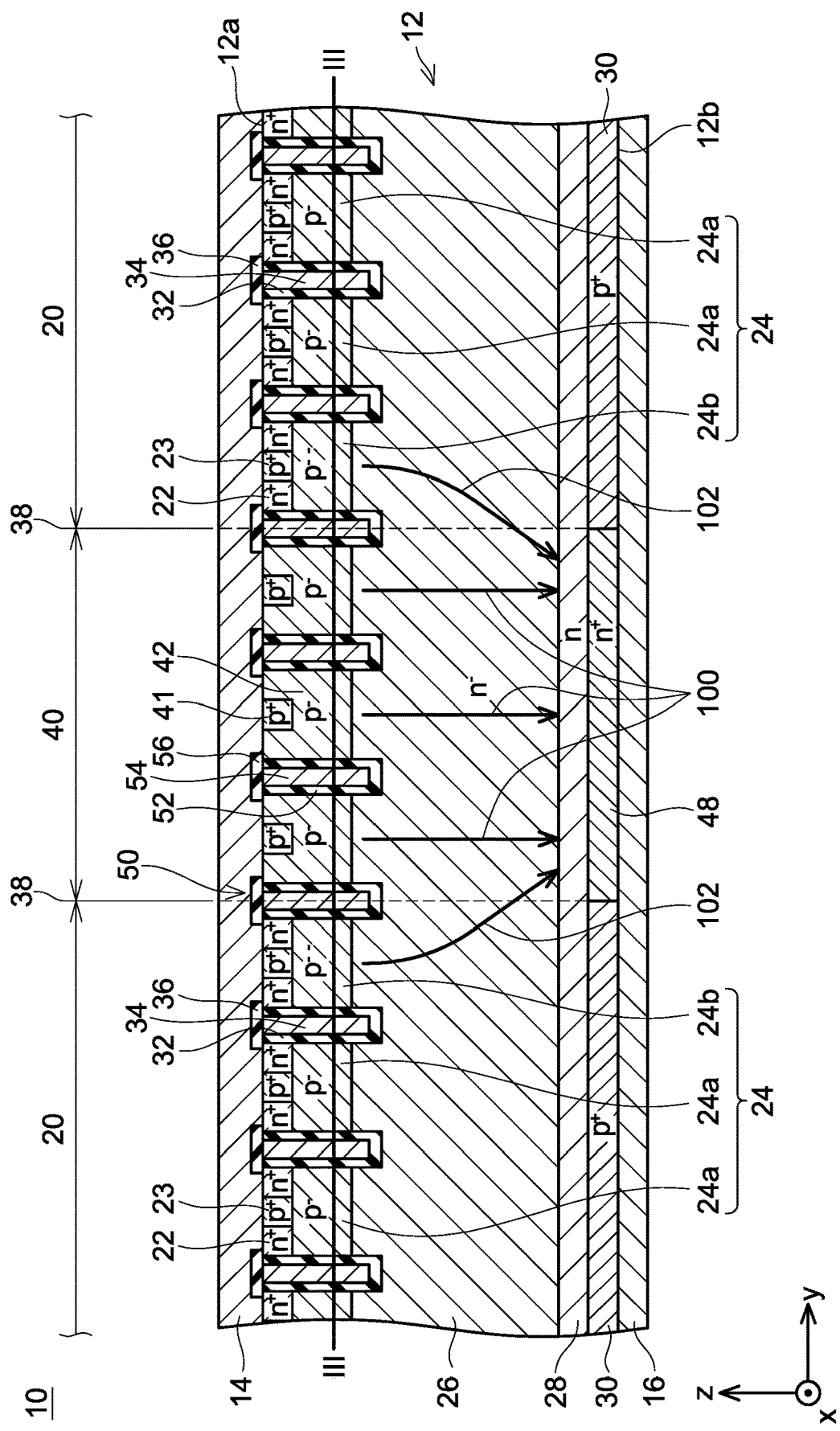
FIG. 2 is a cross-sectional view along a line II-II in FIG. 1.

As shown in FIG. 2, the semiconductor device 10 includes an upper electrode 14 and a lower electrode 16. The upper electrode 14 is arranged on the upper surface 12a (front surface) of the semiconductor substrate 12. The lower electrode 16 is arranged on a lower surface 12b (back surface) of the semiconductor substrate 12. The upper electrode 14 serves both as emitter electrodes for the IGBTs and anode electrodes for the diodes. The lower electrode 16 serves both as collector electrodes for the IGBTs and cathode electrodes for the diodes.

Collector regions 30 and cathode regions 48 are provided within the semiconductor substrate 12. The collector regions 30 and the cathode regions 48 are provided in a range including the lower surface 12b of the semiconductor substrate 12. The collector regions 30 are p-type regions having a high p-type impurity density, and make ohmic contact with the lower electrode 16. The cathode regions 48 are n-type regions having a high n-type impurity density, and make ohmic contact with the lower electrode 16. In the range including the lower surface 12b of the semiconductor substrate 12, each collector region 30 is provided over an entirety of its corresponding IGBT region 20, and each cathode region 48 is provided over an entirety of its corresponding diode region 40. In other words, as shown in FIG. 1, when the semiconductor substrate 12 is seen along the z direction (thickness direction of the semiconductor substrate 12), semiconductor regions that overlap with the collector regions 30 are the IGBT regions 20, and semiconductor regions that overlap with the cathode regions 48 are the diode regions 40.

The semiconductor substrate 12 further includes a buffer region 28, a drift region 26, body regions 24, body contact regions 23, emitter regions 22, anode regions 42, and anode contact regions 41.

The buffer region 28 is an n-type region having a lower n-type impurity density than the cathode regions 48. The buffer region 28 is distributed across the IGBT regions 20 and the diode regions 40. The buffer region 28 is provided above the collector regions 30, and is in contact with the collector regions 30 in the IGBT regions 20. The buffer region 28 is provided above the cathode regions 48, and is in contact with the cathode regions 48 in the diode regions 40.

The drift region 26 is an n-type region having a lower n-type impurity density than the buffer region 28. The drift region 26 is distributed across the IGBT regions 20 and the diode regions 40. The drift region 26 is provided above the buffer region 28 in the IGBT regions 20 and in the diode regions 40, and is in contact with the buffer region 28.

The body regions 24 are p-type regions having a low p-type impurity density. The body regions 24 are arranged in the IGBT regions 20. The body regions 24 are provided above the drift region 26 and are in contact with the drift region 26.

The body contact regions 23 are p-type regions having a higher p-type impurity density than the body regions 24. The body contact regions 23 are arranged in the IGBT regions 20. Each body contact region 23 is arranged locally on an upper portion of the corresponding body region 24, and is in contact with this body region 24. The body contact regions 23 are separated from the drift region 26 by the body regions 24. The body contact regions 23 are arranged in a range including the upper surface 12a of the semiconductor substrate 12, and make ohmic contact with the upper electrode 14.

The emitter regions 22 are n-type regions having a higher n-type impurity density than the drift region 26. The emitter regions 22 are arranged in the IGBT regions 20. Each emitter region 22 is arranged locally on an upper portion of the corresponding body region 24, and is in contact with this body region 24. The emitter regions 22 are separated from the drift region 26 by the body regions 24. Each emitter region 22 is arranged in the range including the upper surface 12a of the semiconductor substrate 12 in a range where no body contact region 23 exists. The emitter regions 22 make ohmic contact with the upper electrode 14.

The anode regions 42 are p-type regions having a low p-type impurity density. The anode regions 42 are arranged in the diode regions 40. The anode regions 42 are provide above the drift region 26 and are in contact with the drift region 26.

The anode contact regions 41 are p-type regions having a higher p-type impurity density than the anode regions 42. The anode contact regions 41 are arranged in the diode regions 40. Each anode contact region 41 is arranged locally on an upper portion of the corresponding anode region 42, and is in contact with this anode region 42. The anode contact regions 41 are separated from the drift region 26 by the anode regions 42. The anode contact regions 41 are arranged in the range including the upper surface 12a of the semiconductor substrate 12, and make ohmic contact with the upper electrode 14.

A plurality of trenches 50 is provided in the upper surface 12a of the semiconductor substrate 12. Each trench 50 extends long along the x direction. The plurality of trenches 50 is arranged in rows along the y direction with intervals in between them. The plurality of trenches 50 is provided in both the IGBT regions 20 and the diode regions 40. Each trench 50 extends from the upper surface 12a to a depth reaching the drift region 26.

An inner surface of each trench 50 in the IGBT regions 20 is covered by a gate insulating film 32. A gate electrode 34 is arranged in each trench 50 in the IGBT regions 20. Each gate electrode 34 is insulated from the semiconductor substrate 12 by the gate insulating film 32. An interlayer insulating film 36 is arranged above each gate electrode 34. Each gate electrode 34 is insulated from the upper electrode 14 by the interlayer insulating film 36.

The drift region 26 is in contact with the gate insulating films 32 at lower ends of the trenches 50. The body regions 24 are in contact with the gate insulating films 32 above the drift region 26. The emitter regions 22 are in contact with the gate insulating films 32 above the body regions 24. Thus, each gate electrode 34 is opposed to the emitter region 22, the body region 24, and the drift region 26 via the gate insulating film 32.

An inner surface of each trench 50 in the diode regions 40 is covered by an insulating film 52. A control electrode 54 is arranged in each trench 50 in the diode regions 40. Each control electrode 54 is insulated from the semiconductor substrate 12 by the insulating film 52. An interlayer insulating film 56 is arranged above each control electrode 54. Each control electrode 54 is insulated from the upper electrode 14 by the interlayer insulating film 56. A potential of the control electrodes 54 is independent from a potential of the gate electrodes 34. For example, the potential of the control electrodes 54 may be fixed to a potential equal to that of the upper electrode 14.

The drift region 26 is in contact with the insulating films 52 at lower ends of the trenches 50. The anode regions 42 are in contact with the insulating films 52 above the drift region 26. Thus, each control electrode 54 is opposed to the anode region 42 and the drift region 26 via the insulating film 52.

Figure 3:
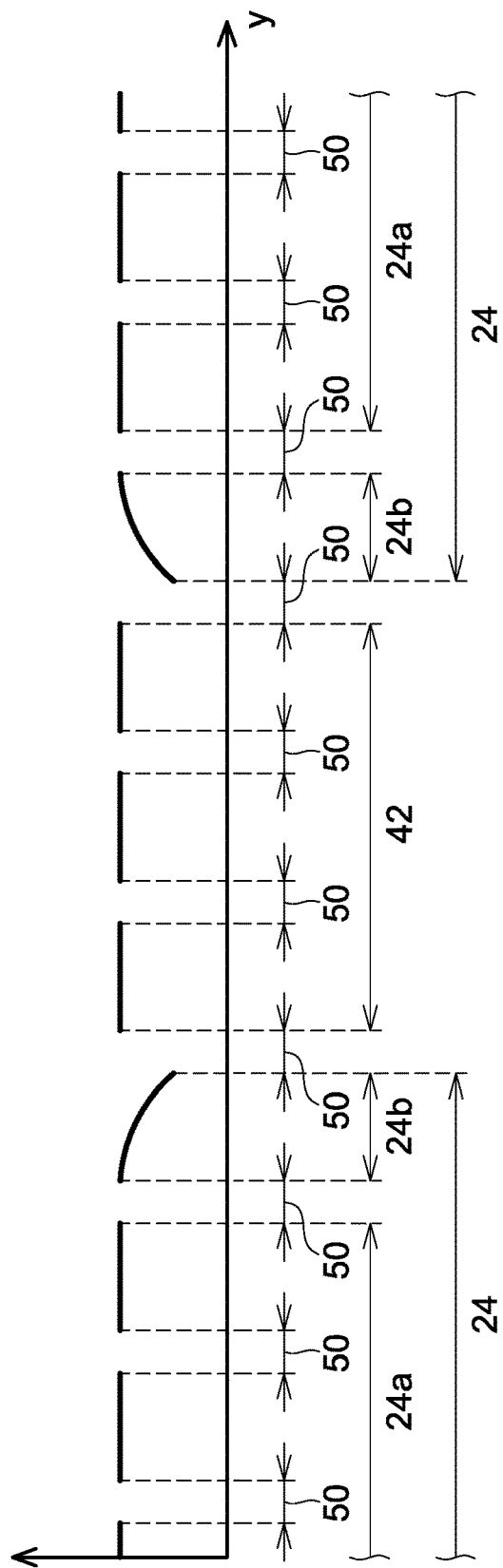
FIG. 3 is a graph showing a p-type impurity density along a line in FIG. 2.
Figure 4:
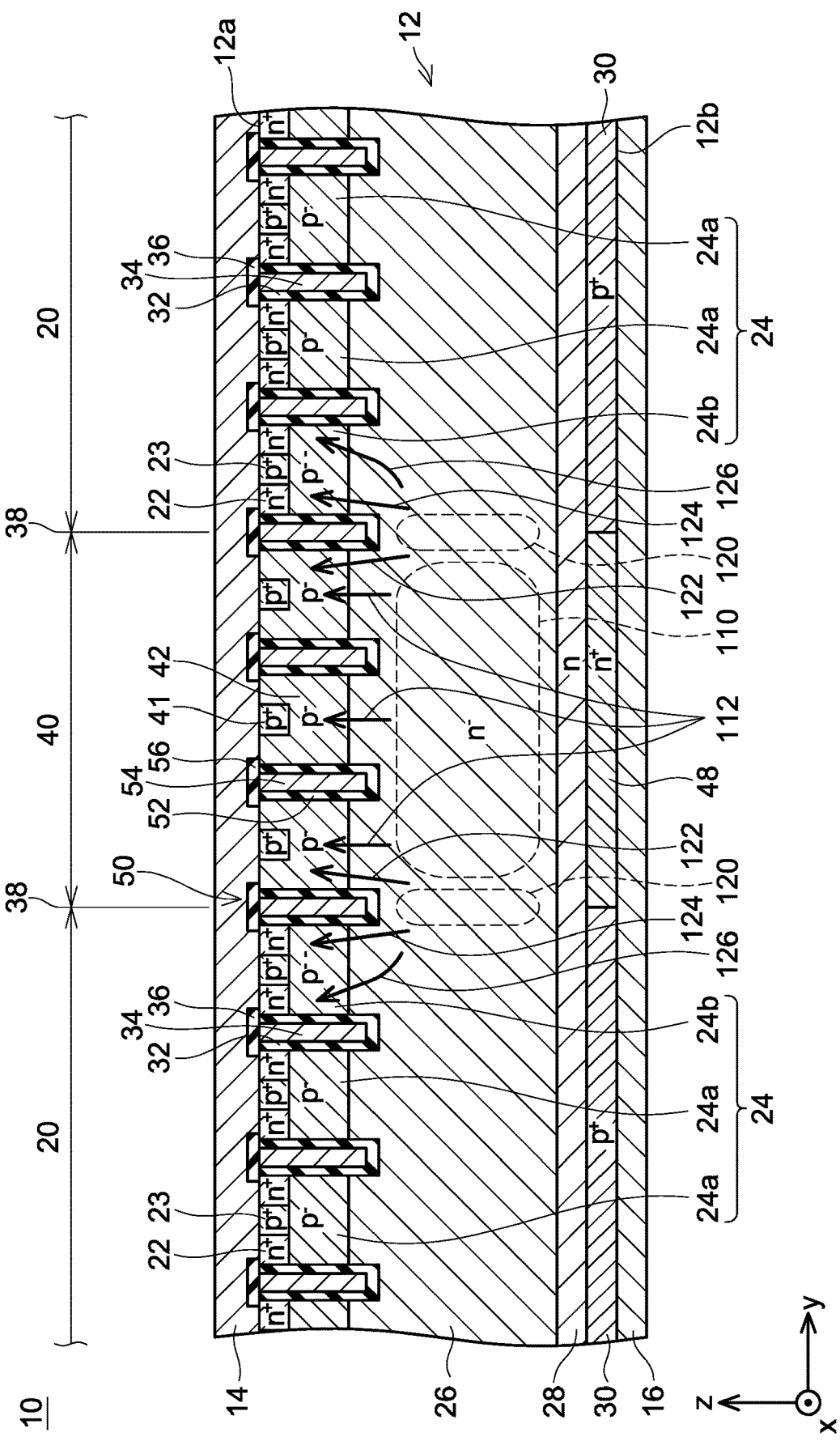
FIG. 4 is a cross-sectional view along the line II-II in FIG. 1.

FIG. 3 shows a distribution of the p-type impurity density along a line in FIG. 2. Since the line runs across the trenches 50, a graph is intermittent in ranges of the trenches 50 in FIG. 3. As shown in FIG. 3, the body regions 24 include first body regions 24a and second body regions 24b having the lower p-type impurity density than the first body regions 24a. In the cross section shown in FIG. 2, each body regions 24 is partitioned into plural portions (portions interposed between pairs of trenches 50) by the trenches 50. The second body regions 24b are provided at portions closest to the diode regions 40 among the portions partitioned by the trenches 50. Each second body region 24b is adjacent to the anode region 42 via the trench 50 in the y direction. The first body regions 24a are arranged at all the portions among the portions partitioned by the trenches 50 except for the portions where the second body regions 24b are provided (that is, the portions closest to the diode regions 40). The first body regions 24a are adjacent to the second body regions 24b in the y direction via the trenches 50. The first body regions 24a are adjacent to the second body regions 24b at opposite sides from the anode regions 42. That is, in the y direction, the second body regions 24b are arranged between the first body regions 24a and the anode regions 42. As above, in the body regions 24, the p-type impurity density varies in a horizontal direction (y direction).

As shown in FIG. 3, the p-type impurity density in the first body regions 24a is substantially equal to the p-type impurity density in the anode regions 42. Further, the p-type impurity density in the second body regions 24b is lower than the p-type impurity density in the first body regions 24a and the p-type impurity density of the anode regions 42. The p-type impurity density of each second body region 24b is distributed so as to decrease from a first body region 24a side toward an anode region 42 side.

Next, an operation of the semiconductor device 10 will be described. The diodes are configured between the upper electrode 14 and the lower electrode 16 by the anode contact regions 41, the anode regions 42, the drift region 26, the buffer region 28, and the cathode regions 48 (hereinbelow termed main diodes). When a potential that is higher than that of the lower electrode 16 is applied to the upper electrode 14, the main diodes turn on. That is, electrons flow from the lower electrode 16 toward the upper electrode 14 through the cathode regions 48, the buffer region 28, the drift region 26, the anode regions 42, and the anode contact regions 41. Concurrently, as shown by arrows 100 in FIG. 2, holes flow into the drift region 26 from the upper electrode 14 through the anode contact regions 41 and the anode regions 42. As a result, a conductivity modulation phenomenon occurs in the drift region 26 and a resistance of the drift region 26 drops. Thus, the electrons can flow in the drift region 26 at low loss. Due to this, losses generated in the main diodes are suppressed. The holes that have flown into the drift region 26 flow to the lower electrode 16 through the buffer region 28 and the cathode regions 48.

Further, a parasitic diode is formed at each of boundaries 38 between the diode regions 40 and the IGBT regions 20 by the body contact region 23, the second body region 24b, the drift region 26, the buffer region 28 and the cathode region 48. Due to this, when the main diodes turn on, the parasitic diodes also turn on, and as shown by arrows 102 in FIG. 2, holes flow form the second body regions 24b into the drift region 26. In the drift region 26, the holes flow obliquely downward toward each cathode region 48. Due to this, the holes that had flown into the drift region 26 from the anode region 42 and the holes that had flown into the drift region 26 from the second body regions 24b mix in the drift region 26 in vicinities of the boundaries 38. Due to this, a hole density becomes higher in the drift region 26 in vicinities of the boundaries 38 than in the drift region 26 located at a center of each diode region 40. However, in the present embodiment, since the p-type impurity density of the second body regions 24b is low, the inflow of the holes shown by the arrows 102 is suppressed. Due to this, the holes that flow into the drift region 26 from the second body regions 24b as shown by the arrows 102 are in a small quantity. Due to this, the hole density is suppressed from becoming extremely high in the drift region 26 in the vicinities of the boundaries 38.

When the potential of the upper electrode 14 is lowered to a potential that is lower than the potential of the lower electrode 16 after the main diodes have turned on, the main diodes perform a recovery operation. That is, the holes existing in the drift region 26 are discharged to the upper electrode 14. Due to this, recovery current (reverse current) flows instantaneously in the main diodes. As shown in FIG.

4, the holes existing in a range 110 around the center of the drift region 26 flows upward through the anode regions 42 and the anode contact regions 41 as shown by arrows 112, and are discharged to the upper electrode 14. Further, the holes existing in ranges 120 in the vicinities of the boundaries 38 are discharged to the upper electrode 14 through the anode regions 42 and the anode contact regions 41 as shown by arrows 122 or through the second body regions 24b and the body contact regions 23 as shown by arrows 124. As mentioned above, in a state where the main diodes are turned on, the holes exist at higher concentration in the ranges 120 in the vicinities of the boundaries 38 than in the range 110 around the center. Due to this, the recovery current that flows as shown by the arrows 122, 124 becomes highly concentrated than the recovery current that flows as shown by the arrows 112. That is, the recovery current concentrates in the anode regions 42 and the second body regions 24b in the vicinities of the boundaries 38. However, as aforementioned, in the on-state of the main diodes, the hole density is suppressed from becoming extremely high in the ranges 120 in the vicinities of the boundaries 38 by the second body regions 24b. Due to this, the recovery current that flows as shown by the arrows 122, 124 upon the recovery operation does not become excessively high. As above, the second body regions 24b suppress high recovery current from flowing in the vicinities of the boundaries 38. Due to this, an excessively high load is prevented from being applied to the semiconductor substrate 12.

Further, as aforementioned, the p-type impurity density decreases from the first body region 24a side toward the anode region 42 side in the second body regions 24b. Thus, an electric resistance of the second body regions 24b is low on the first body region 24a side and high on the anode region 42 side. Due to this, the electric resistance of the second body regions 24b is high in paths indicated by the arrows 124 (shortest paths reaching the upper electrode 14 from the ranges 120 through the second body regions 24b), and the electric resistance of the second body regions 24b is low in paths indicated by arrows 126 that detour around the shortest paths and pass through the second body regions 24b. Due to this, the electric resistances are substantially equal in the paths indicated by the arrows 124 and the paths indicated by the arrows 126. Accordingly, the recovery current that flows from the ranges 120 in the vicinities of the boundaries 38 toward the upper electrode 14 flows by being distributed among the paths indicated by the arrows 124 and the paths indicated by the arrows 126. That is, the recovery current flows through the second body regions 24b in a distributed manner. Due to this, the concentration of the recovery current is further suppressed, and the load applied to the semiconductor substrate 12 is further reduced.

Further, when the semiconductor device 10 is to be operated as the IGBTs, a potential that is higher than the upper electrode 14 is applied to the lower electrode 16. When the potential of the gate electrodes 34 is raised to a potential higher than a gate threshold, channels are formed in the body regions 24 in ranges in contact with the gate insulating films 32. When this happens, electrons flow from the upper electrode 14 to the lower electrode 16 through the emitter regions 22, the channels, the drift region 26, the buffer region 28, and the collector regions 30. Concurrently, holes flow from the lower electrode 16 to the upper electrode 14 through the collector regions 30, the buffer region 28, the drift region 26, the body regions 24, and the body contact regions 23. That is, the IGBTs turn on, and current flows from the lower electrode 16 to the upper electrode 14. When the potential of the gate electrodes 34 is decreased to a potential that is lower than the gate threshold, the channels vanish, and the current stops. That is, the IGBTs turn off. As aforementioned, the body regions 24 are provided with the first body regions 24a and the second body regions 24b. Since the first body regions 24a occupy most of the body regions 24, characteristics of the IGBTs are determined mainly by the p-type impurity density in the first body regions 24a. Since the p-type impurity density in the first body regions 24a is higher than the p-type impurity density in the second body regions 24b, the characteristics of the IGBTs (gate threshold, breakdown voltage, etc.) can be set to suitable values. That is, by providing the first body regions 24a, the gate threshold can be set high and the breakdown voltage can be set high as compared to a case where a p-type impurity density of the entire body regions 24 is low. Further, when the IGBTs turn on, the current flows in the second body regions 24b as well, so large areas of the IGBT regions 20 that function as the IGBTs can be ensured. Due to this, a current capacity of the IGBTs can be ensured without increasing a size of the semiconductor device 10.

As described above, the load applied to the semiconductor substrate 12 upon the recovery operation can be reduced by providing the second body regions 24b having the low p-type impurity density at the positions adjacent to the anode regions 42. Further, the IGBT characteristics can be improved by providing the first body regions 24a having the high p-type impurity density at the positions adjacent to the second body regions 24b on the opposite side from the anode regions 42.

Figure 5:
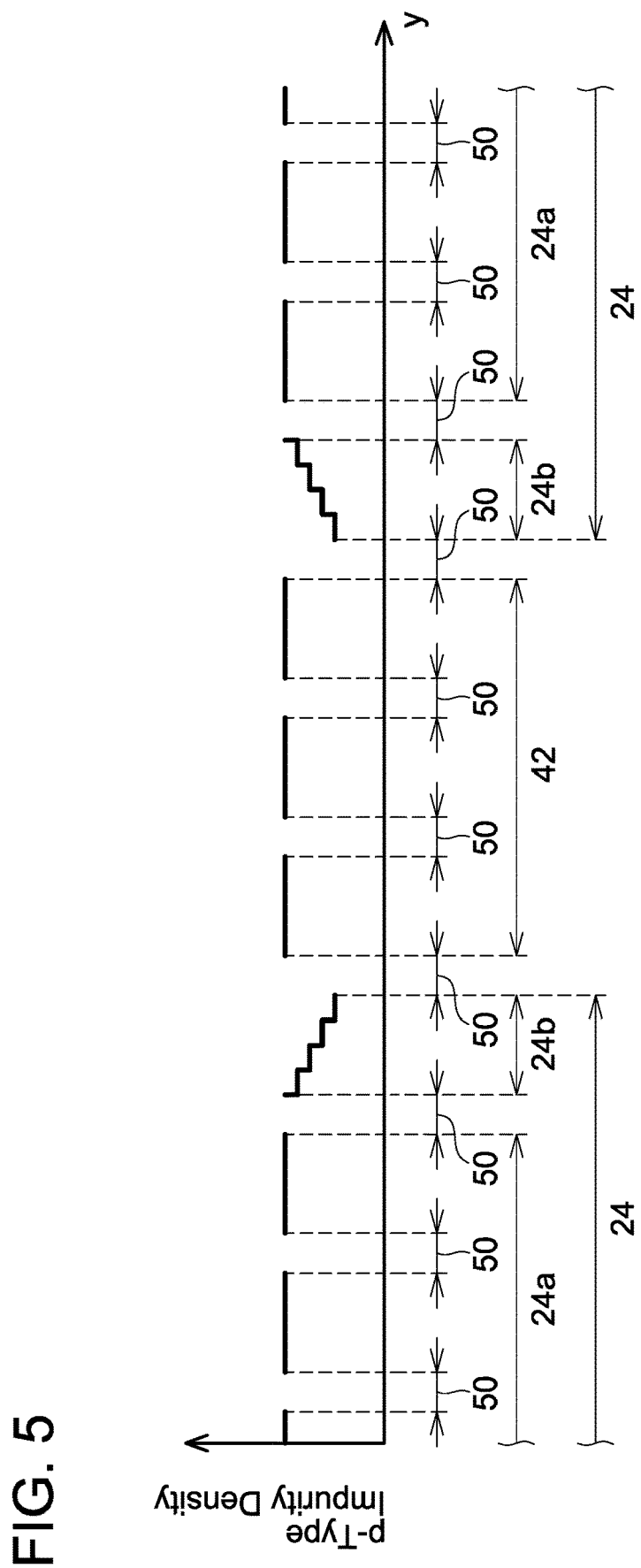
FIG. 5 is a graph corresponding to FIG. 3 showing a p-type impurity density of a semiconductor device of a variant.
Figure 6:
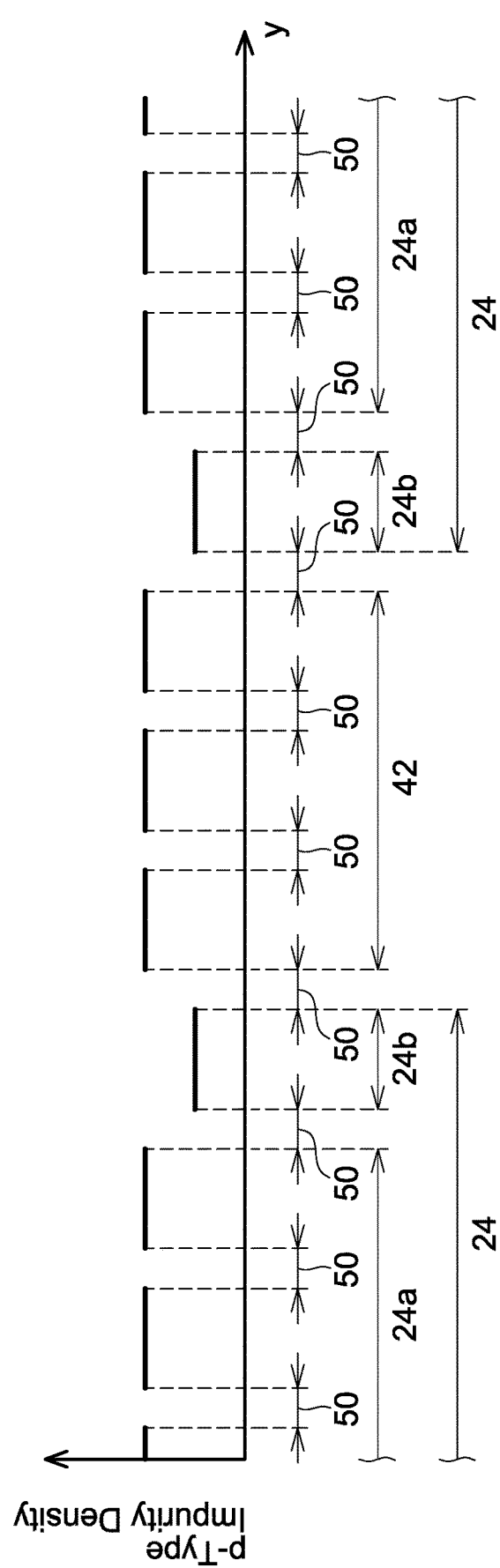
FIG. 6 is a graph corresponding to FIG. 3 showing a p-type impurity density of a semiconductor device of a variant.

In the above embodiment, as shown in FIG. 3, the p-type impurity density in the second body regions 24b continuously decreased from the first body region 24a side toward the anode region 42. However, as shown in FIG. 5, the p-type impurity density in the second body regions 24b may decrease in a stepwise manner from the first body region 24a side toward the anode region 42. Further, as shown in FIG. 6, the p-type impurity density in the second body regions 24b may be substantially constant. Further, in the above embodiment, the p-type impurity density of the anode regions 42 and the p-type impurity density of the first body regions 24a were substantially equal, however, these p-type impurity densities may be different.

Figure 7:
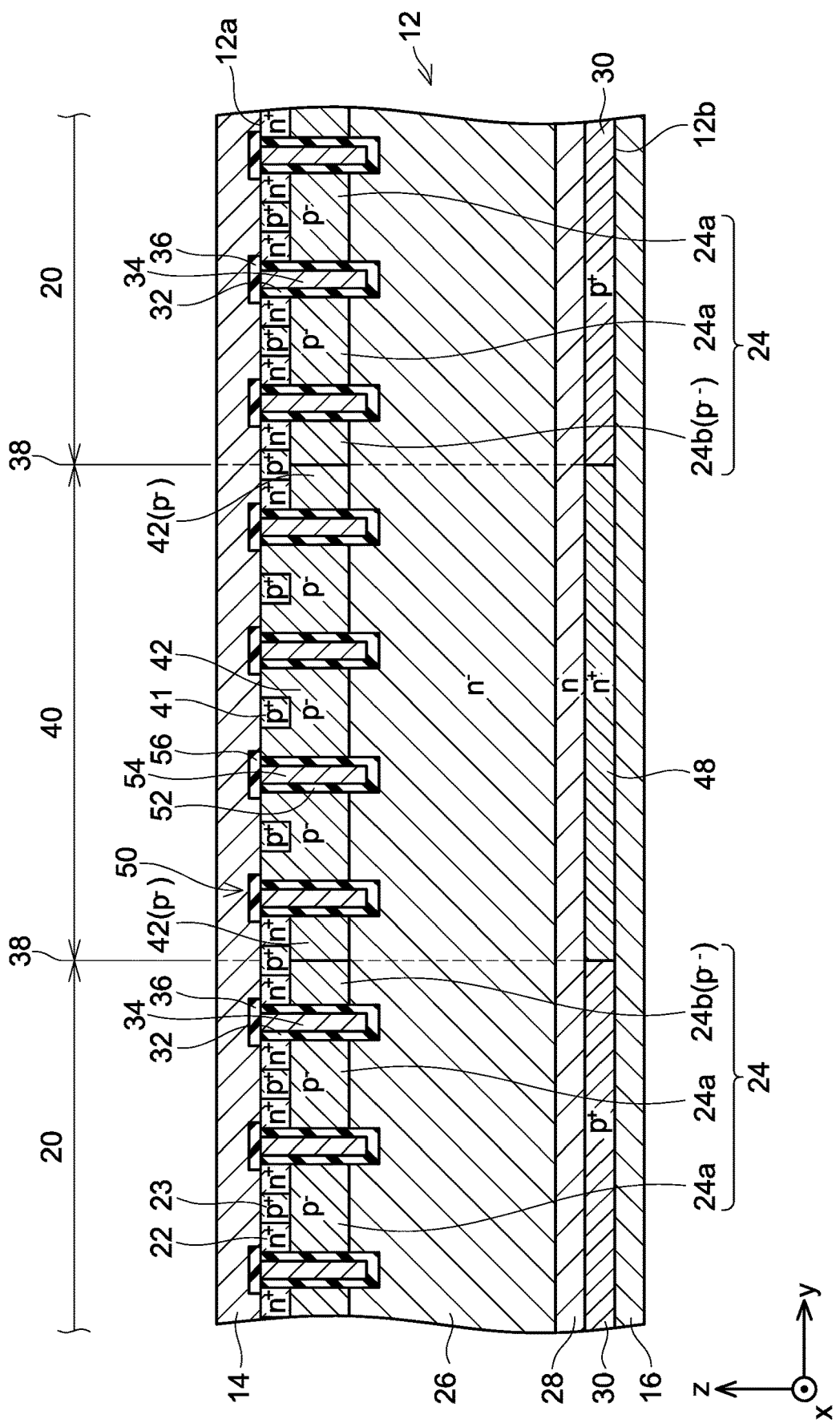
FIG. 7 is a cross-sectional view of a semiconductor device of a variant corresponding to FIG. 2.

Further, in the above embodiment, the trenches 50 where located on the boundaries 38 (that is, boundaries between the cathode regions 48 and the collector regions 30). However, as shown in FIG. 7, positions of the boundaries 38 and the trenches 50 may be displaced from each other. In this case, a structure is implemented in which the anode regions 42 and the second body regions 24b are directly adjacent without interposing the trenches 50 therebetween.

Figure 8:
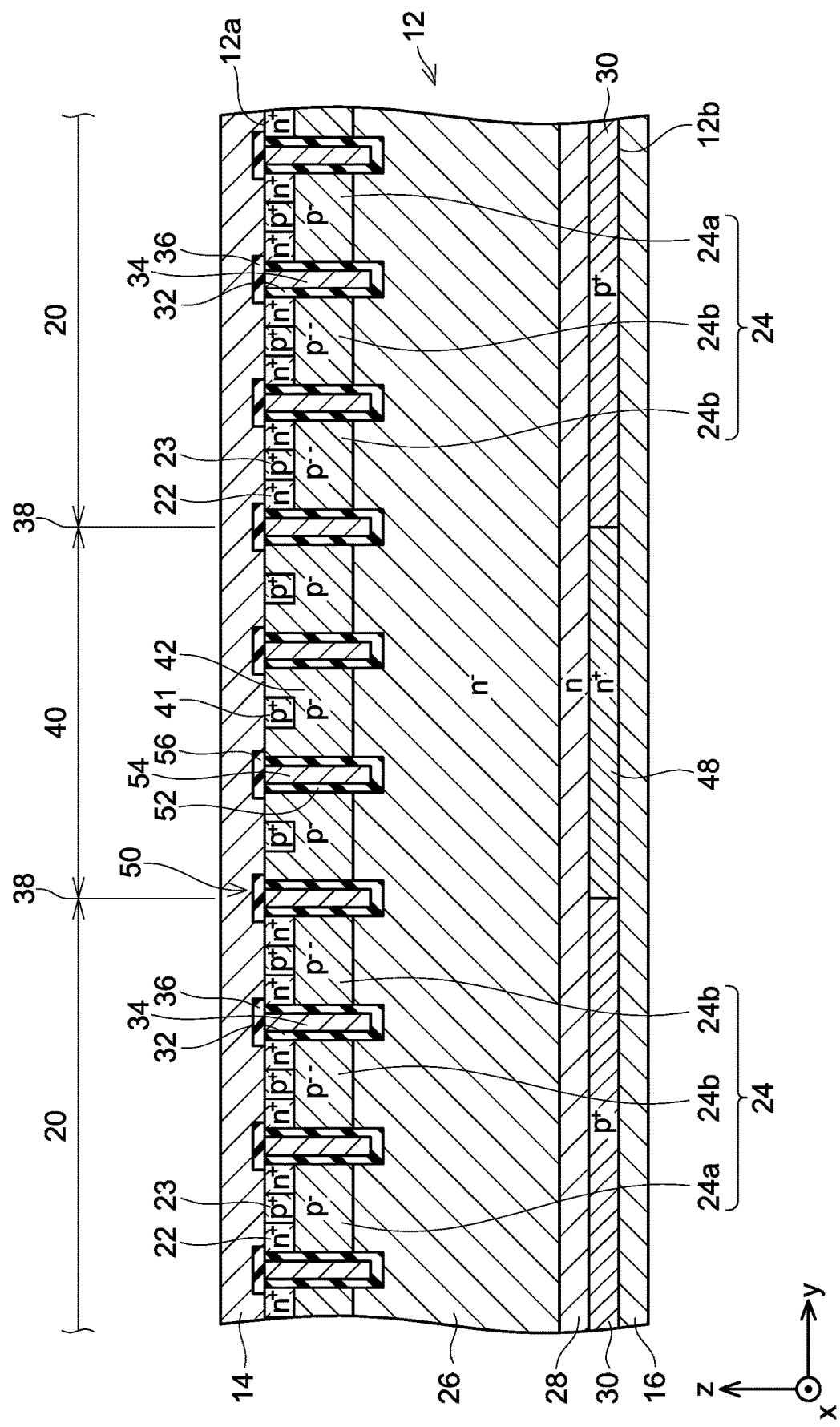
FIG. 8 is a cross-sectional view of a semiconductor device of a variant corresponding to FIG. 2.

Further, in the above embodiment, the second body regions 24b are provided only in the portions that are closest to the diode regions 40 among the portions partitioned by the trenches 50. However, as shown in FIG. 8, the second body regions 24b may be provided in two or more portions that are closest and second closest to the diode regions 40 among the portions partitioned by the trenches 50.

Figure 9:
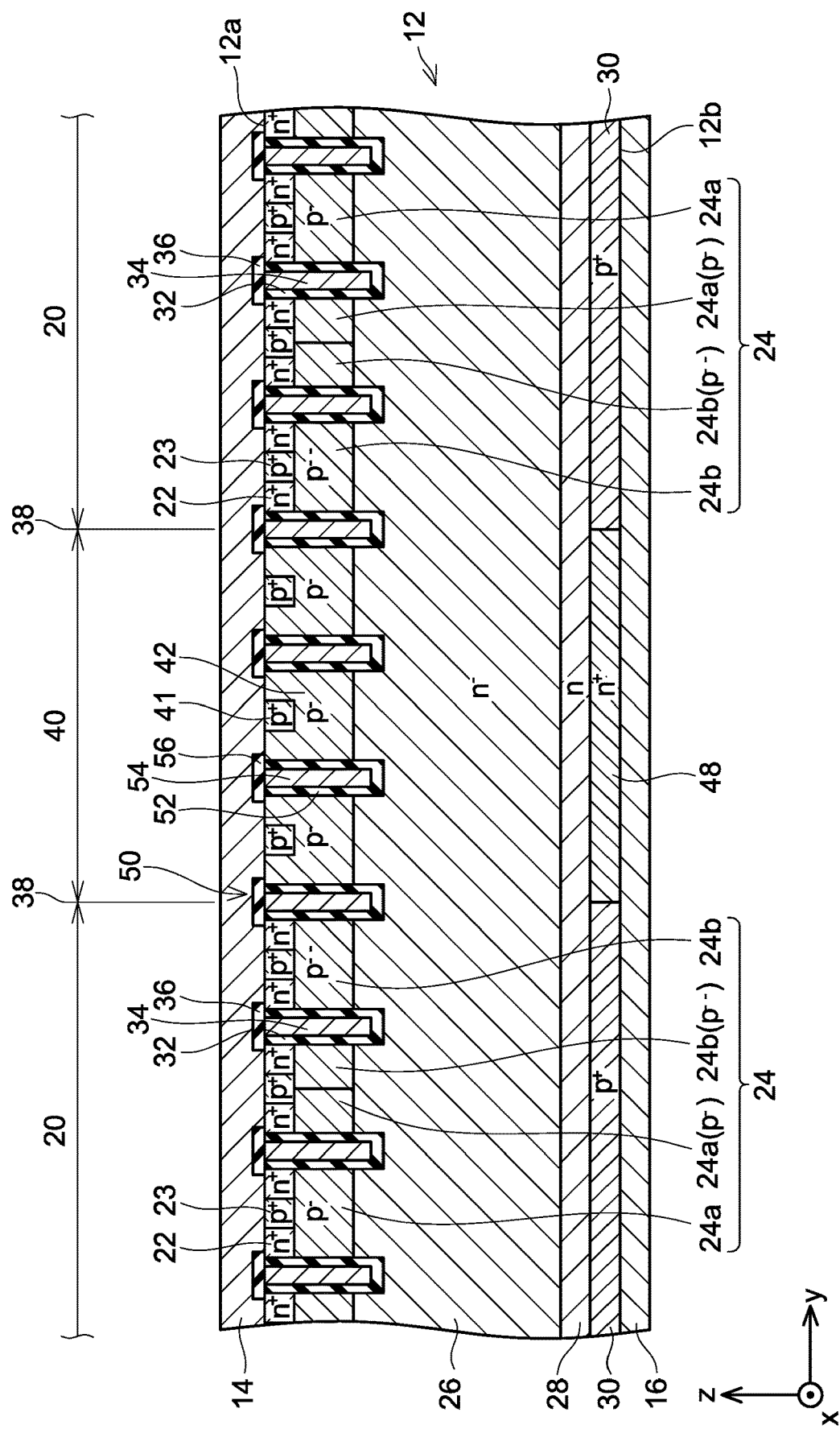
FIG. 9 is a cross-sectional view of a semiconductor device of a variant corresponding to FIG. 2.

Further, in the above embodiment, the first body regions 24a and the second body regions 24b were adjacent via the trenches 50. However, as shown in FIG. 9, the first body regions 24a and the second body regions 24b may be directly adjacent without interposing the trenches 50 therebetween.

Further, in the above embodiment, the body regions 24 and the anode regions 42 were in contact with the drift region 26. However, other regions (e.g., n-type regions, p-type regions, or structures that combine an n-type region and a p-type region (laminate structure, etc.)) may be arranged between the body regions 24 and the drift region 26 as well as between the anode regions 42 and the drift region 26. Further, in the above embodiment, the buffer region 28 was arranged between the drift region 26 and the cathode regions 48 as well as between the drift region 26 and the collector regions 30. However, the buffer region 28 may not be arranged at these positions.

Technical elements disclosed herein will be listed below. Each of the technical elements is each independently useful.

In one example of the semiconductor device disclosed herein, the p-type impurity density in the second body region may be distributed so as to decrease toward the anode region. The p-type impurity density in the second body region may be distributed so as to continuously decrease toward the anode region or decrease in a stepwise manner toward the anode region.

According to this configuration, the recovery current flows more uniformly in the vicinity of the boundary between the diode region and the IGBT region. Due to this, the load applied on the semiconductor substrate can further be reduced.

The technical features described in the description and the drawings may technically be useful alone or in various combinations, and are not limited to the combinations as originally claimed. Further, the technique described in the description and the drawings may concurrently achieve a plurality of aims, and technical significance thereof resides in achieving any one of such aims.

What is claimed is:

1. A semiconductor device, comprising:
a semiconductor substrate;
a trench provided in an upper surface of the semiconductor substrate;
a gate insulating film provided in the trench;
a gate electrode provided in the trench and insulated from the semiconductor substrate by the gate insulating film;
an upper electrode being in contact with the upper surface; and
a lower electrode being in contact with a lower surface of the semiconductor substrate,
wherein
the semiconductor substrate comprises a collector region of p-type and a cathode region of n-type in a range being in contact with the lower electrode,
along a thickness direction of the semiconductor substrate, a semiconductor region overlapping with the collector region is an IGBT region and a semiconductor region overlapping with the cathode region is a diode region,
the trench is provided in the IGBT region,
the semiconductor substrate comprises:
a drift region of n-type distributed across the IGBT region and the diode region, provided above the collector region and the cathode region, and being in contact with the gate insulating film;
a body region of p-type, provided above the drift region in the IGBT region, and being in contact with the gate insulating film;
a body contact region of p-type, provided above the body region, having a p-type impurity density higher than a p-type impurity density in the body region, and being in contact with the upper electrode;
an emitter region of n-type, provided above the body region, being in contact with the upper electrode, being in contact with the gate insulating film, and separated from the drift region by the body region;
an anode region of p-type provided above the drift region in the diode region; and
an anode contact region of p-type, provided above the anode region, having a p-type impurity density higher than a p-type impurity density in the anode region, and being in contact with the upper electrode,
the body region comprises a first body region and a second body region having a p-type impurity density lower than any of a p-type impurity density in the first body region and the p-type impurity density in the anode region,
the second body region is adjacent to the anode region, and
the first body region is adjacent to the second body region at an opposite side from the anode region.

2. The semiconductor device of claim 1, wherein the p-type impurity density in the second body region is distributed so as to decrease toward the anode region.

3. The semiconductor device of claim 2, wherein the p-type impurity density in the second body region is distributed so as to continuously decrease toward the anode region.

4. The semiconductor device of claim 2, wherein the p-type impurity density in the second body region is distributed so as to decrease in a stepwise manner toward the anode region.

* * * * *